United States Patent [19]

Zschimmer

[11] 4,145,390

[45] Mar. 20, 1979

[54] PROCESS FOR MOUNTING COMPONENTS ON A BASE BY MEANS OF THIXOTROPIC MATERIAL

[76] Inventor: Gero Zschimmer, Adelmannstrasse 5, 8000 Munich 82, Fed. Rep. of Germany

[21] Appl. No.: 803,139

[22] Filed: Jun. 3, 1977

[30] Foreign Application Priority Data

Jun. 15, 1976 [DE] Fed. Rep. of Germany ....... 2627178

[51] Int. Cl.² ............................................ B29C 27/00
[52] U.S. Cl. ....................................... 264/69; 29/626; 156/73.6
[58] Field of Search ....................... 264/23.69; 29/626; 156/73.1, 73.6

[56] References Cited

U.S. PATENT DOCUMENTS

| | | | |
|---|---|---|---|
| 3,516,155 | 6/1970 | Smith | 29/626 |
| 3,561,107 | 2/1971 | Best | 29/626 X |

*Primary Examiner*—Thomas P. Pavelko
*Attorney, Agent, or Firm*—Parmelee, Johnson, Bollinger & Bramblett

[57] ABSTRACT

The invention relates to a process for mounting in particular electronic components on a base by means of thixotropic material whereby the material is transferred to the base by dipping a die and the component in a stock and then pressing the component on the material layer thus produced whereby the dipping and/or pressing motion of the die or the component is superimposed by a vibration for liquidefying the thixotropic material.

20 Claims, No Drawings

PROCESS FOR MOUNTING COMPONENTS ON A BASE BY MEANS OF THIXOTROPIC MATERIAL

This invention relates to a process of mounting in particular electronic components on a base by means of thixotropic material, whereby the material is transferred to the base by dipping a die or the component in a stock and then pressing the component on the material layer thus produced.

Previously the ensuing motions and forces of the die or the component were continuous.

It is the object of the present invention to make the proportioning of the material on dipping and mounting the components more accurate.

This object is solved according to the invention by superimposing a vibration liquidefying the thixotropic material on the dipping and/or the pressure motion of the die and/or the component.

In this manner it is possible to take the adhesive from the stock without or at least with very little tab formation as compared to the conventional processes and to deposit the same on the base and to mount the components firmly on the base without excessive energy, this being of particular advantage with fragile components. By varying the frequency and/or the amplitude of the vibration, it is possible to obtain a high degree of precision the quantity of adhesive taken on dipping. Thus it is possible to adapt the size and viscosity of the fluidity zones to the prevailing conditions with great accuracy. This is true also of the working time. Finally a better wetting of the surface with adhesive is obtained.

In general, the die and the component will be permitted to vibrate. There may be instances also, however, where the vibrations are transferred to the material via the stock container.

The vibrations may, in particular, lie between 1 HZ and 10 KHZ. The amplitude may, for example, be 0.5 mm. The vibration may be linear, circular or elliptical.

The vibration may occur on level parallel to the surface of the material, but may also run on a level different to the surface.

Vibration may occur both during the whole of the working time or only during parts of it. Thus, e.g., it might be useful to dip a die first into material without vibration and then only to start its vibration, finally to extract it from the material either with or without vibration. During the motion of the die from the stock to the base, the vibration might be stopped. It might also be useful to deposit several spots of the material on a base without vibration by the silk screen printing process and then to mount the components to be mounted by vibration.

It may also be useful to vary the vibrations during the processing in shape, frequency and/or amplitude.

It is also proposed to vary the dipping and/or pressure motions of the die and/or the component.

It may also be useful to stop the die intermittently while the material is deposited if there still is a material connection between the die and the base thus to reduce the formation of tabs. There is also the possibility of letting the die vibrate with exceptionally high frequency.

On depositing the material on a base with a die, the die may either be in contact with or spaced from the base.

The invention relates to a die for accomplishing the process according to the invention.

This die can, according to the invention, be rugged or fitted with milled slots. This configuration will achieve an optimum transfer of the vibration.

The working face of the die can also be concave. This leads to a domed shaped extraction, and will, when vibration is used for the depositing and mounting the component, prevent all air-pockets.

The three-dimensional shape of the working surface may also be adapted to the shape of the material on the base. If, for example, a material with domed surface and a hole is required on the base, the working surface of the die must be shaped accordingly, e.g. of negative or female configuration. These shapes of the material may be useful for mounting components of appropriate shape. It may also be useful to give the working surface of the die a circular, elliptical, squared, annular or similar shape, if a corresponding material shape should be required.

It may also be useful if the die was given a protrusion of its working surface for forming negative or female tabs.

Finally the die might be fitted with several clearly separate working surfaces, thus permitting a simultaneous application of several material dots on a base.

What is claimed is:

1. A process for mounting components on a base utilizing a thixotropic material, the steps of said process including:
    dipping said component into a stock of said thixotropic material such that at least one surface of said component has a layer of thixotropic material thereon;
    pressing said component against said base such that said surface of said component having said layer of thixotropic material is in contact with said base; and
    vibrating said thixotropic material during at least one of the above steps;
    whereby said component is mounted on said base.

2. A process as claimed in claim 1 wherein said thixotropic material is vibrated during said dipping step and during said pressing step.

3. A process as claimed in claim 1 wherein said thixotropic material is vibrated in a level parallel to the surface of said material.

4. A process as claimed in claim 1 further including the step of varying the vibrations in shape, frequency and amplitude.

5. A process as claimed in claim 1 wherein the dipping motion of said component is varied.

6. A process as claimed in claim 1 wherein the pressing motion of said component is varied.

7. A process for mounting components on a base utilizing a thixotropic material and a die, the steps of said process including:
    dipping said die into a stock of said thixotropic material such that the working surface of said die has a layer of thixotropic material thereon;
    transferring said thixotropic material from said working surface of said die to the surface of said base;
    pressing said component against the portion of said surface of said base to which said thixotropic material was transferred; and
    vibrating said thixotropic material during at least one of the above dipping or pressing steps;
    whereby said component is mounted on said base.

8. A process as claimed in claim 7 wherein said thixotropic material is vibrated during said dipping step and during said pressing step.

9. A process as claimed in claim 7 wherein said thixotropic material is vibrated in a level parallel to the surface of said material.

10. A process as claimed in claim 7 further including the step of varying the vibrations in shape, frequency and amplitude.

11. A process as claimed in claim 7 wherein the dipping motion of said die is varied.

12. A process as claimed in claim 7 wherein said pressing motion of said die is varied.

13. A process as claimed in claim 7 wherein said thixotropic material is transferred to said base while said die is spaced apart from said base.

14. A process as claimed in claim 7 wherein said thixotropic material is transferred to said base by having said die contact said base.

15. A process as claimed in claim 7 wherein the working surface of said die is uneven.

16. A process as claimed in claim 15 wherein the working surface of said die is fitted with milled slots.

17. A process as claimed in claim 15 wherein the working surface of said die is rough.

18. A process as claimed in claim 7 wherein the working surface of said die is concave.

19. A process as claimed in claim 7 wherein the working surface of said die is three dimensional and adapted to said material on the base.

20. A process as claimed in claim 7 wherein said die has a plurality of working surfaces.

* * * * *